United States Patent [19]

Vettari

[11] Patent Number: 4,644,258
[45] Date of Patent: Feb. 17, 1987

[54] ELECTRONIC SWITCH

[75] Inventor: Giancarlo Vettari, Amberg, Fed. Rep. of Germany

[73] Assignee: Siemens Aktiengesellschaft, Munich, Fed. Rep. of Germany

[21] Appl. No.: 725,669

[22] Filed: Apr. 22, 1985

[30] Foreign Application Priority Data

Apr. 30, 1984 [DE] Fed. Rep. of Germany ....... 3416046

[51] Int. Cl.$^4$ .......................... G05F 1/455; G08B 5/00
[52] U.S. Cl. ..................... 323/324; 323/902; 340/645; 307/252 B; 307/252 P
[58] Field of Search ....................... 323/324, 325, 902; 340/635, 644, 645; 307/252 B, 252 P

[56] References Cited

U.S. PATENT DOCUMENTS

| 3,866,194 | 2/1975 | Lawton | 340/644 X |
| 4,065,683 | 12/1977 | Clarke | 307/264 |
| 4,158,150 | 6/1979 | Dever | 307/252 B |
| 4,361,798 | 11/1982 | Tolmie, Jr. | 323/324 |

OTHER PUBLICATIONS

EDN Magazine, (1981), Jun., No. 13, Boston, Mass., pp. 192 and 196, "Three ICs Control Triacs Digitally", Julian R. Bryttan.

Primary Examiner—Peter S. Wong
Assistant Examiner—Emanuel Todd Voeltz
Attorney, Agent, or Firm—Kenyon & Kenyon

[57] ABSTRACT

An electronic switch with CSE wiring, especially a triac, has a load connected in series therewith to an a-c voltage network. A rectifier bridge circuit has its a-c terminals connected into the driving circuit of the electronic switch. The d-c terminals of the bridge circuit are connected to a light-emitting diode poled in the conduction direction. Since the firing current for the switch is periodically repeated, the light-emitting diode indicates the switching state of the triac since the brief pauses without current of the LED are not perceived by the human eye.

2 Claims, 1 Drawing Figure

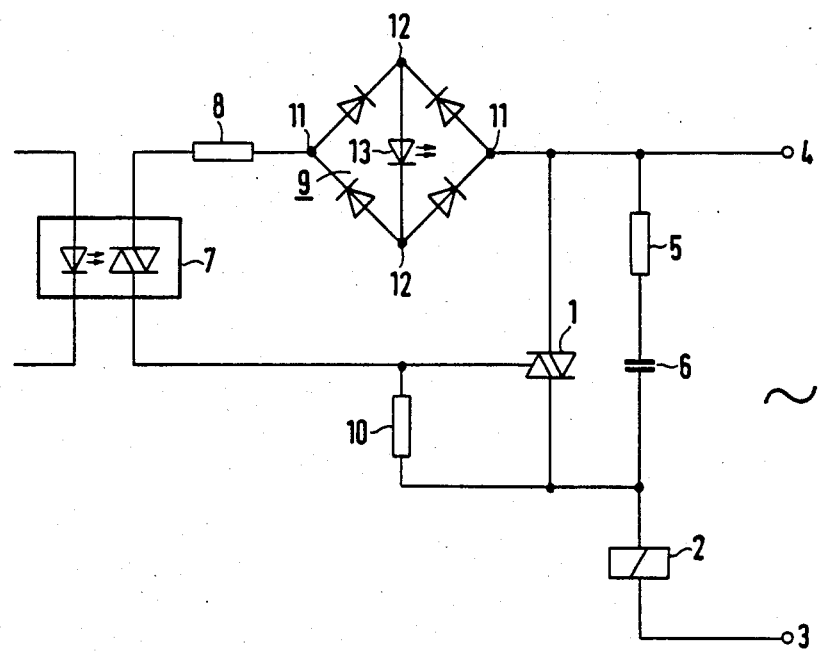

ELECTRONIC SWITCH

BACKGROUND OF THE INVENTION

The present invention relates to an electronic switch, and especially to a triac with CSE (carrier storage effect) wiring and a load connected in series to an a-c network and having a switch position indicator and an addressing circuit for controlling the electronic switch.

In the known switch of the above-mentioned type, a glow lamp is connected in shunt to the load for indicating the switch position and signals the closed state of the switch. Under unfavorable conditions, however, if for instance, the load is not connected, the glow lamp lights up as a result of the CSE wiring even if the electronic switch does not conduct.

SUMMARY OF THE INVENTION

It is, therefore, an object of the present invention to provide for an electronic switch of the above-mentioned type a switch position indicator which is of simple design and provides a reliable indication.

The above and other objects are achieved by the provision that the a-c terminals of a rectifier bridge circuit are connected into the addressing or control circuit for the switch. The d-c terminals of the bridge circuit are connected to a light-emitting diode (LED) in the conducting direction. It has been found to be advantageous if an optotriac with a series-connected protective resistor is arranged in the control circuit.

BRIEF DESCRIPTION OF THE DRAWING

An embodiment of the present invention will be described with reference to the single drawing FIGURE, which is a schematic diagram of the electronic switch and associated circuitry according to the present invention.

DETAILED DESCRIPTION

With reference now to the drawing FIGURE, the electronic switch comprises a triac 1 which is connected to a load 2, for instance, a relay contactor coil, in series with the network terminals 3, 4 of the a-c network. Shunted across the traic is the so-called CSE-wiring (carrier storage effect) which comprises the resistor 5 and the series capacitor 6. An optotriac 7 is provided for driving triac 1 which is connected on one side to the gate control circuit for the triac 1 and on the other side, via a protective resistor 8 and rectifier bridge circuit 9, to one main terminal of the traic 1. A resistor 10 is connected between the load and other main terminal of triac 1 and the gate of triac 1. The a-c terminals 11 of the rectifier bridge circuit 9 are connected in the driving circuit of the triac, between resistor 8 and a main terminal of the triac 1. A light-emitting diode 13 is connected in the forward direction to the d-c terminals 12 of the rectifier bridge circuit 9.

If the optotriac is addressed, the firing current of the triac flows from the network terminal 4, via the rectifier bridge circuit 9 and LED 13, the protective resistor 8, the optotriac 7, the gate of the triac 1 and the load 2. The current flowing in the driving circuit before the triac is switched into conduction is sufficient to make the light-emitting diode 13 light up. Since the firing process is repeated periodically in the case of a-c operation, the light-emitting diode 13 can indicate the switch position of the triac since the eye of the observer does not perceive the brief extinction of the light emitting diode.

In the foregoing specification, the invention has been described with reference to a specific exemplary embodiment thereof. It will, however, be evident that various modifications and changes may be made thereunto without departing from the broader spirit and scope of the invention as set forth in the appended claims. The specification and drawing are, accordingly, to be regarded in an illustrative rather than in a restrictive sense.

What is claimed is:

1. In an electronic switch, especially including a triac with CSE (carrier storage effect) wiring and having a load connected in series with the triac to an a-c voltage network, a switch position indicator and a control circuit for the electronic switch, a rectifier bridge circuit having a-c and d-c terminals, the a-c terminals connected in the control circuit, the d-c terminals of the bridge circuit having a light emitting diode connected in the forward conducting direction therebetween, said electronic switch being placed in a conductive condition when voltage on the a-c voltage network is conducted to a control input of the electronic switch by the control circuit, said voltage on the a-c voltage network further being conducted through said light emitting diode in order to place the electronic switch into a conductive condition.

2. The electronic switch recited in claim 1, wherein said control circuit comprises an optotriac connected in series with a protective resistor and the bridge circuit.

* * * * *